March 5, 1957 F. WOHLMAN 2,784,295

SEMICONDUCTOR TRANSLATING DEVICE CONDUCTOR WELDER AND CUTOFF APPARATUS

Filed June 1, 1955 4 Sheets-Sheet 1

FRED WOHLMAN,
INVENTOR.

BY Henry Heyman

ATTORNEY

FRED WOHLMAN,
INVENTOR.

BY Henry Heyman

ATTORNEY

FRED WOHLMAN,
INVENTOR.

BY Henry Heyman

ATTORNEY

FRED WOHLMAN,
INVENTOR.

BY Henry Heyman
ATTORNEY 2,784,295
Patented Mar. 5, 1957

2,784,295

SEMICONDUCTOR TRANSLATING DEVICE CONDUCTOR WELDER AND CUTOFF APPARATUS

Fred Wohlman, Inglewood, Calif., assignor to Hughes Aircraft Company, Culver City, Calif., a corporation of Delaware Application June 1, 1955, Serial No. 512,508

6 Claims. (Cl. 219—78)

This invention has general utility in the field of semiconductor translating device manufacture and relates specifically to an apparatus for producing subassemblies of semiconductor translating devices comprising generally one of the conductors forming a portion of these devices.

In exceptionally small electrical or electronic apparatus, for example, the various types of semiconductor translating devices such as diodes, transistors, rectifiers, photocell devices and the like, the handling of components of these devices has become a serious problem, as such handling must be accomplished manually by operators of the heretofore known machinery used in the manufacture of the devices. In most of the above noted semiconductor translating devices, many of the assembly procedures have heretofore been entirely manually accomplished, thus requiring considerable time, effort and the entrance of human elements, which naturally produced some errors. It is common practice to employ very small diameter wire or very thin ribbon to form one conductor element or whisker of a semiconductor translating device, the ribbon or wire being bent or otherwise formed in a prescribed manner following attachment thereof to a larger conductor portion. The physical length of the small wire, or in some cases the extremely thin and narrow ribbon, is quite critical, inasmuch as a predetermined position must be established for a free end of this wire upon assembly with other components of the devices. The practice has been for an operator manually to place a short length of wire across one end of a lead, hold the wire in this position and spotweld one end thereof to the end of the lead. This manual operation is obviously quite difficult in view of the sizes of the components, necessity for handling such components and requirements as to dimensional tolerances in the finished subassembly unit.

In view of the aforementioned difficulties in connection with manual assembly of semiconductor translating device components, and in view of requirements for low cost, efficient, effective and reliable devices, it has, therefore, become necessary to utilize as much automatically operable machinery as possible in order to meet these ends. In this connection the physical handling of the rather delicate and often frangible components of semiconductor translating devices by elements of a machine presents a considerable problem when considered in the light of required mass production of the devices. The various components must be handled in a manner eliminating the possibility of breakage, bending or crimping or other similar damage to the completed subassemblies, in order that these subassemblies may properly be used in cooperation with other partially completed units.

It is accordingly, one important object of the present invention to provide a novel semiconductor translating device conductor welder and cutoff apparatus.

It is another important object of the present invention to provide a novel semiconductor translating device subassembly manufacturing apparatus having means for automatically delivering a portion of relatively small material to a position adjacent one end of another semiconductor element and for affixing this material to the element.

It is a further important object of the present invention to provide a semiconductor translating device subassembly manufacturing apparatus having controlled means operable from a common element whereby accurately to correlate various functions of the apparatus.

Still another object of this invention is to provide novel means for withdrawing conductor material from a supply, presenting a predetermined length thereof, securing one end of this length to another semiconductor element and severing this portion of the material from the supply source.

A still further object of this invention is to provide a novel operation sequencing arrangement for a semiconductor translating device conductor, welder and cutoff apparatus.

Other and further important objects of the present invention will become apparent from the disclosures in the following detailed specification, appended claims and accompanying drawings, wherein:

Figure 5:
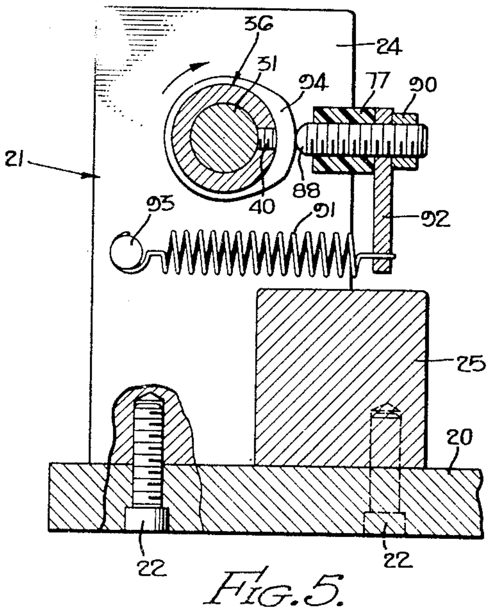
Fig. 5 is an enlarged fragmentary sectional view taken substantially as indicated by line 5—5, Fig. 2, and showing a portion of the common cam means adapted for operation of a welding arm forming a portion of the present apparatus.

With reference to the drawings, the device of the present invention includes a base 20 which serves as a support for the mechanism included herein. A support structure indicated generally at 21 is mounted on the base 20 and secured thereto by means of screws 22, Fig. 5. The support 21 includes vertically extending side portions 23 and 24, and an interconnecting web 25.

The side portions 23 and 24 are provided with aligned bores 26 and 27 respectively in which roller bearings 28 and 30 are positioned. The bearings 28 and 30 serve as journals for portions of a shaft 31. One end of the shaft 31 is connected to a motor 32 that is mounted on a bracket 33 which is, in turn, carried by the base 20. The shaft 31 serves as a common driving means for a plurality of cams which are adapted to operate various portions of this apparatus. A stop switch operating cam 34 is carried by the shaft 31 and secured thereto by means of a screw 35 adjacent an outboard side of the support side portion 24. A welding head position control cam 36 is mounted on the shaft 31 inboard of the support side portion 24, with a pulse switch control cam 37 and a cutter control cam 38 being disposed on the shaft 31 between the cam 36 and the support side portion 23. The cams 36, 37 and 38 are retained in spaced relationship on the shaft 31 by means of set screws 40 which are adapted for engagement with the shaft. The end of the shaft 31, opposite from the motor 32, is fitted with a face cam 41 that is secured in position by means of a nut 42 that threadedly engages a threaded end of the shaft 31.

Figure 1:
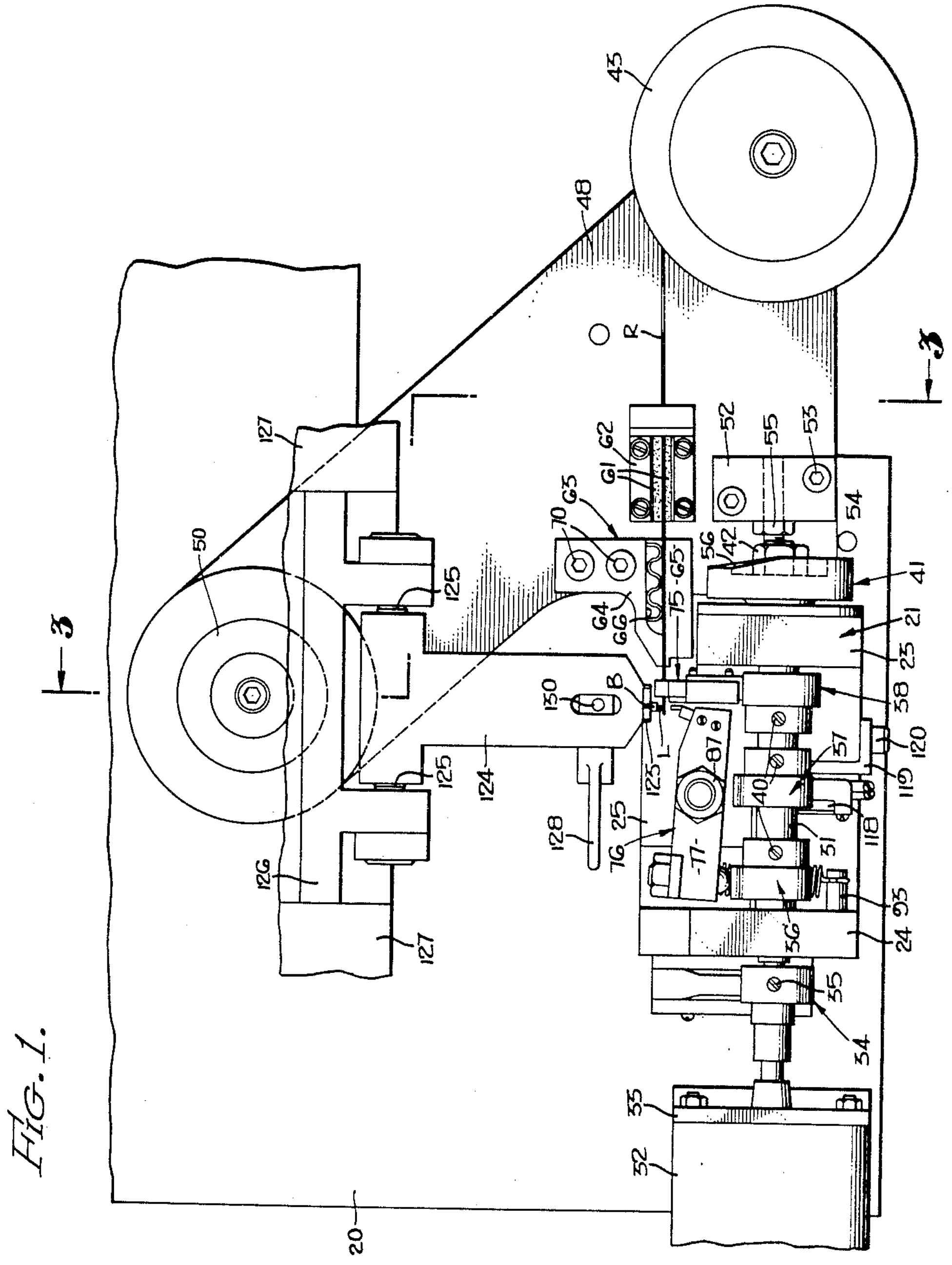
Figure 1 is a top plan view of the semiconductor translating device conductor welder and cutoff apparatus of the present invention.
Figure 2:
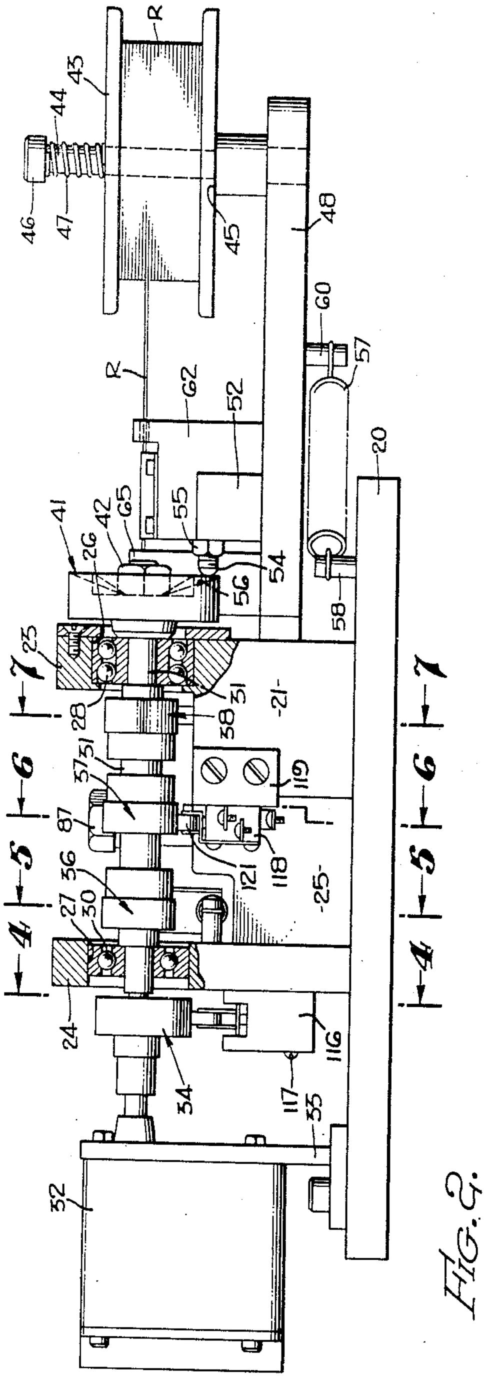
Fig. 2 is a front elevational view thereof with portions shown in section.

As shown in Figs. 1 and 2, a supply of material, such as a metallic ribbon R, is carried by a spool 43 that is rotatably journalled on a shaft 44. The shaft 44 has a shouldered enlargement 45 on the lower end thereof and a head 46 on the upper end thereof, there being a compression spring disposed between the head 46 and the upper surface of the spool 43. The lower end of the shaft 44 is secured to a generally L-shaped plate 48 that has one portion thereof mounted on a roller bearing 50 which is, in turn, carried by a shaft 51 disposed upwardly from the base 20. The axis of the shaft 51 is remote from the other portions of the present apparatus for a purpose to be hereinafter more fully described.

Figure 3:
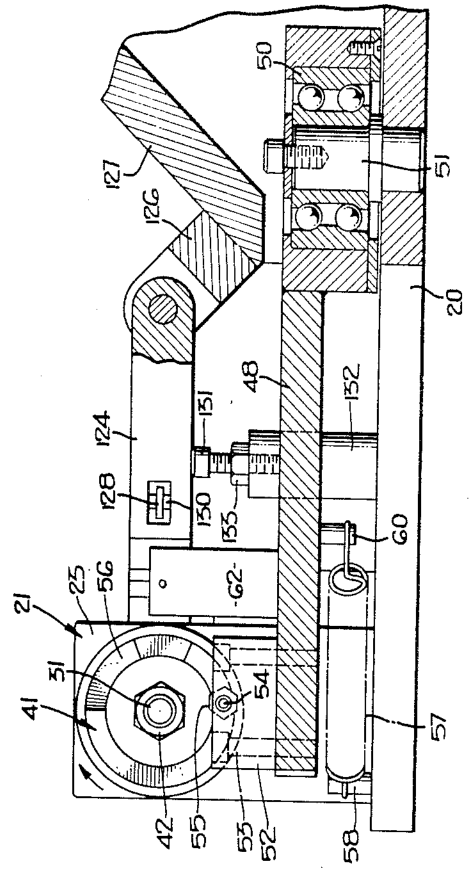
Fig. 3 is a transverse sectional view through a portion of the support arrangement, as taken substantially as indicated by line 3—3, Fig. 1.
Figure 4:
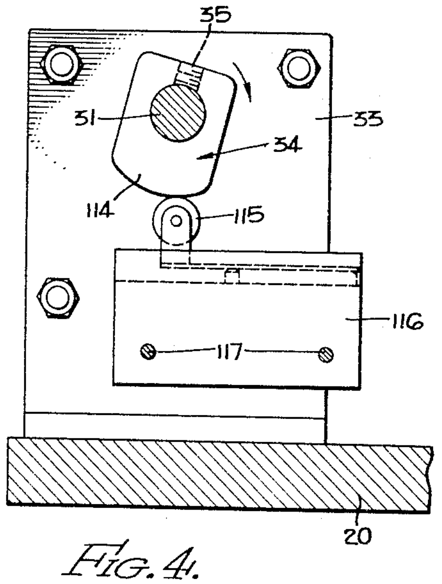
Fig. 4 is an enlarged fragmentary sectional view showing a portion of the common cam means adapted for operation of a limit switch in the apparatus, as taken substantially as indicated by line 4—4, Fig. 2.

The plate 48 is adapted to carry a block 52, that is secured in position by means of screws 53 and from which an adjustable cam follower 54 extends. The cam follower 54 is adapted to be locked in position by means of a lock nut 55 and is further adapted for cooperation with a variable cam surface 56 of the face cam 41. The follower 54 is biased in a direction toward the cam 41 by means of a tension spring 57, one end to which is connected a pin 58 disposed upwardly from the base 20, the other end being connected to a pin 60 disposed downwardly from a lower face of the plate 48. Thus, as the cam 41 is rotated in the direction indicated by the arrow in Fig. 3, the plate will be rocked in a flat plane about the axis of the shaft 51 in a manner to move the spool 43 in a reciprocating manner relative to other portions of the apparatus and with portions of the plate moving on a line that is substantially parallel to the axis of the shaft 31.

Figure 10:
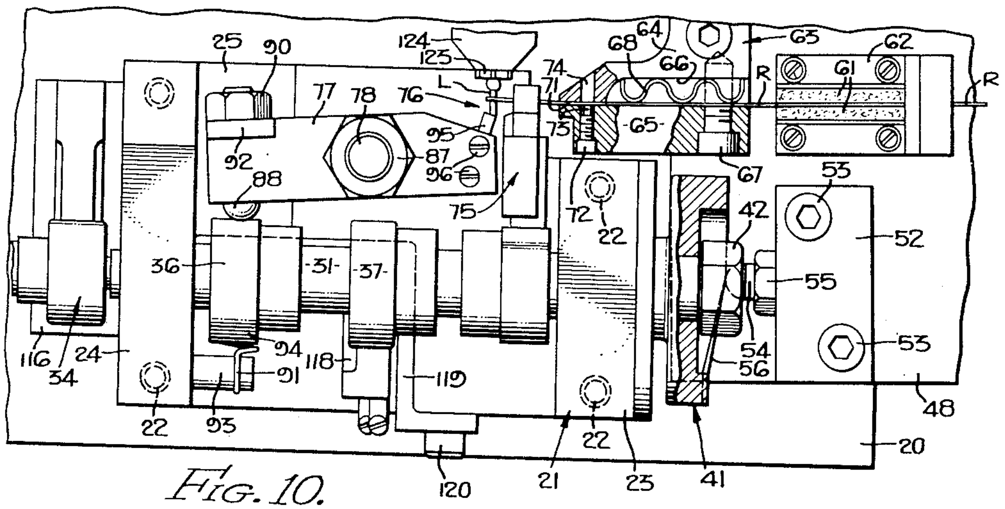
Fig. 10 is an enlarged fragmentary top plan view similar to portions of Fig. 1, with portions in section and showing components in different positions.

With reference to Figs. 1 and 10 the plate 48 is further adapted to carry a pair of elongated felt cleaning members 61 that are mounted on a vertically disposed bracket 62 which is, in turn, fixed to the plate 48. Furthermore, the plate 48 carries a tension mechanism, indicated generally at 63, which includes a rearward block member 64 and a forward block member 65. The member 64 is provided with an elongated open faced slot 66, with the member 65 being affixed to the member 64 by means of screws 67 and providing another side for the slot 66. A convoluted leaf spring 68 is disposed in the slot 66 and retained therein by means of compression of the various convolutions thereof with the sides of this slot. The member 64 is positioned on the plate 48 so that the side of the slot 66, formed by the member 65, will be aligned with the space between the felt cleaning members 61, and is retained on the plate 48 by means of a pair of screws 70. Additionally, one face of the member 64 is provided with an elongated open ended groove 71 through which the ribbon R may extend. The spring 68 serves to provide force upon the ribbon R in order to restrict movement through the tension mechanism 63, with additional tension being established by means of a screw 72 which threadably engages the member 65 on an axis normal to and intersecting the groove 71, and has a dog portion 73 that extends a short distance into an aligned opening 74 on a same axis in the member 64. The screw 72 is adjusted to a point whereby to apply a slight bending moment to the ribbon R in passage over the dog portion 73, so that an adjustable tension may be applied to the ribbon. From the tension mechanism 63, the ribbon R extends through a cutter mechanism indicated generally at 75 and to a position for use in a manner to be hereinafter more fully described.

Figure 6:
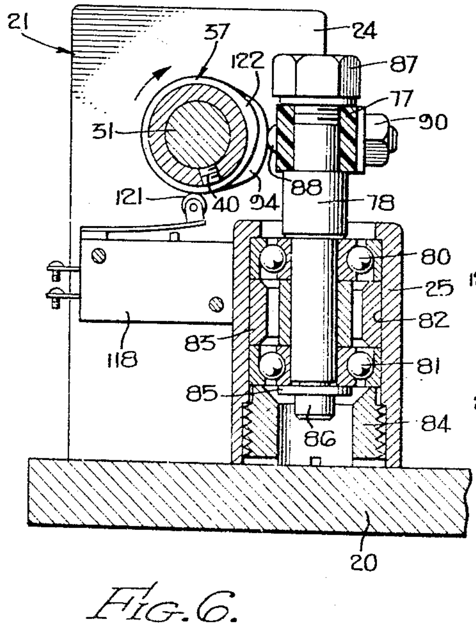
Fig. 6 is another enlarged fragmentary sectional view taken as indicated by line 6—6, Fig. 2, and showing another portion of the common cam means adapted for operation of a switch controlling the delivery of electrical energy to the welding head and further showing the means for mounting the welding head.

In order to provide means for moving a welding head, indicated generally at 76, into position, an arm 77, of dielectric material, is pivotally mounted on a vertically disposed shaft 78 that is, in turn, as shown in Fig. 6, rotatably journalled in roller bearings 80 and 81 that are mounted in a vertical bore 82 formed in the support web 25. The bearings 80 and 81 are maintained in spaced relationship by means of a spacing collar 83 and a nut 84 which abuts an outer race of the bearing 81 and threadably engages the walls of the bore 82. The lower end of the shaft 78 is fitted with a washer 85 which engages an inner race of the bearing 81 and is retained in position by means of a screw 86 engaging the shaft 78. The arm 77 is retained on the shaft 78 by means of a nut 87. One end of the arm 77 is adapted to support an adjustable cam follower 88 that threadably extends through the arm 77, Fig. 5, and is retained in locked position by means of a lock nut 90. The cam follower 88 is adapted for cooperation with the cam 36 and is biased in a direction toward the cam 36 by means of a tension spring 91 that is disposed between a bracket 92 carried by the arm 77 and a pin 93 disposed inwardly from an inboard face of the support side portion 24. Thus, rotation of the cam 36, and engagement of a lobe 94 thereof with the follower 88, will serve reciprocally to pivot the arm 77 and the shaft 78 in the bearings 80 and 81. The other end of the arm 77 is adapted to carry a welding head 95 that is disposed in an angularly disposed bore and secured in position by means of screws 96 which threadably engage the material of the arm 77.

Figure 7:
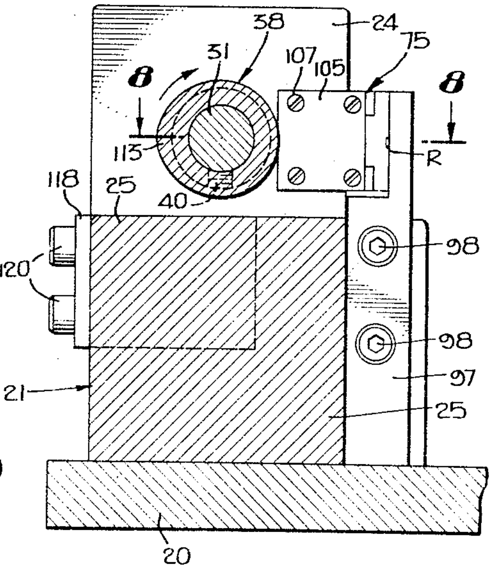
Fig. 7 is a further enlarged fragmentary sectional view taken substantially as indicated by line 7—7, Fig. 2, and showing still another portion of the common cam means adapted for operation of a cutoff device utilized in the present apparatus.
Figures 8, 9, 11:
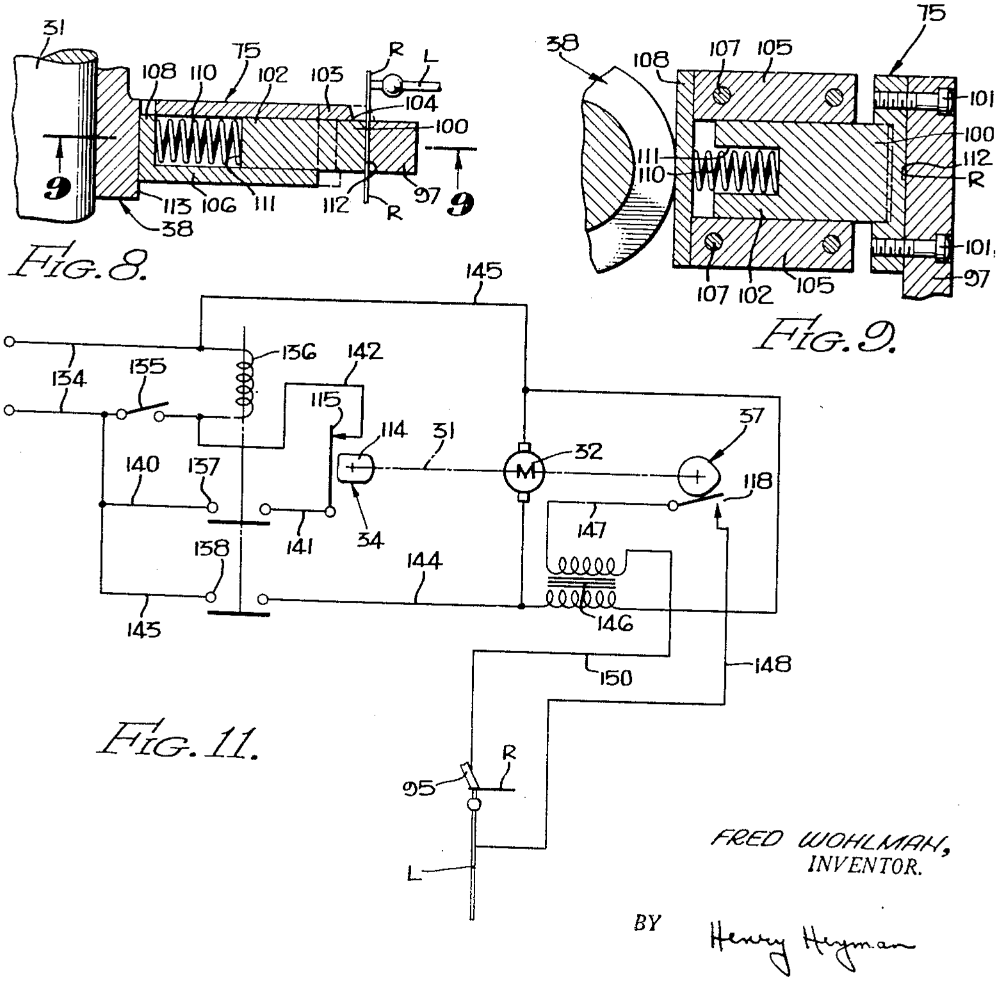
Fig. 8 is a still further enlarged fragmentary sectional view through a portion of the cutoff device taken substantially as indicated by line 8—8, Fig. 7.
Fig. 9 is a fragmentary sectional view in another direction showing details of the cutoff device, as taken substantially as indicated by line 9—9, Fig. 8.
Fig. 11 is a schematic representation of one type of wiring diagram that may be employed with the apparatus of the present invention.

The cutter mechanism 75 is mounted on a vertically disposed bracket 97 that is secured to the support web 25 by means of screws 98. With reference to Figs. 7, 8 and 9, the cutter mechanism per se includes a guide member 100 that is secured in position normal to the upper end of the bracket 97 by means of screws 101. The guide member 100 has a tongue 102 formed integrally therefrom, there being a cutter blade 103, having a cutting edge 104, slidably disposed on one side of the tongue 102. Upper and lower portions of the cutter blade 103 are fitted with integral bar portions 105 that are adapted to engage upper and lower surfaces of the tongue 102. The cutter blade 103 and the bar portions 105 are retained on the tongue 102 by means of an angle securing member 106 that is attached to the portions 105 by means of a plurality of screws 107. The securing member 106 has an angularly disposed portion 108 that extends across ends of the bars 105, there being a compression spring 110 disposed between an inner surface of the portion 108 and a slot 111 formed in one end of the tongue 102. Thus, the cutter blade 103 is biased in a direction away from the guide member 100 by means of the compression spring 110, with an outer surface of the portion 108 of the member 106 being also biased into contact with the outer cam surface of the cam 38. As shown in Figs. 8 and 9, one face of the guide member 100 is provided with an open sided rectangular groove 112, the open side of this groove being closed by a surface of the bracket 97. The ribbon R is adapted for passage through the groove 112 and to a position of use, with oscillation of the blade 103, by action of a lobe 113 on the cam 38 against the outer surface of the portion 108 of the member 106, serving to sever the portion of the ribbon protruding from the groove 112 from the other supply portion thereof.

In order that proper sequencing of the device may be had, the cam 34 has a lobe 114 that is adapted for cooperation with a roller 115 carried by and adapted for cooperation with actuating mechanism of a switch 116. The switch 116 is mounted on the outboard surface of the support side portion 24 and retained thereon by means of screws 117. Another switch 118 is mounted on a bracket 119 that is, in turn, secured to the support web 25 by means of screws 120. The switch 118, Fig. 6, has a roller 121 carried by an arm thereof that is adapted for operation of the switch and cooperation with a lobe 122 of the cam 37. The switch 116 is a normally closed switch while the switch 118 is normally open for a purpose to be hereinafter more fully described in connection with the wiring circuit for the present apparatus.

It is one of the purposes of the present invention to apply and secure a portion of the ribbon R to one end of a lead L. In order to support the lead L a chuck 123, Fig. 10, is carried by a chuck supporting arm 124. The arm 124 is pivoted, by means of trunnions 125, to a supporting bracket 126 that is, in turn, carried by a plate 127 that is disposed in operative conjunction with the base 20. The arm 124 is fitted with a lever 128 that is pivoted thereto as at 130 and serves to open or close the chuck 123 in a customary manner in connection with devices of this type, the particular details of the chuck or the operating mechanism therefor forming no part of the present invention. The chuck 123 is positioned to support the lead L of the semiconductor translating device so that an outer end of this lead will be in positive alignment with the ribbon R being delivered from the groove 112 in the cutter mechanism guide member 100. The lead L is also positioned in another direction in alignment with the welding head 95 of the welding mechanism 76. Downward movement of the arm 124 is limited by means of an adjustable stop defined by a screw 131, Fig. 3, which threadably engages a post 132 that extends upwardly from the base 20. This stop screw 131 is locked into position by means of a lock nut 133.

With reference to Fig. 11, electrical current is provided for the present apparatus through a pair of leads 134, there being a master switch 135 in one of these leads. The leads 134 extend to a coil 136 of a double pole relay that is adapted for closing pairs of contacts 137 and 138. The contacts 137 are connected across the switch 135 by means of leads 140 and 141, the switch 116 and a lead 142, while the contacts 138 connect a lead 143 with one of the leads 134 and a lead 144 extending to the motor 32. The other side of the motor 32 is connected to the other of the leads 134 by means of a lead 145. A transformer 146 has the primary welding thereof connected to the leads 144 and 145 with the secondary winding thereof being connected, by way of a lead 147, to the switch 118, the other side of the switch 118 being connected, by way of a lead 148, with the lead L of the semiconductor translating device. The other side of the secondary winding of the transformer 126 is connected to the welding head 95 by means of a lead 150. It may thus be seen that momentary closure of the switch 135 will energize the coil 136 of the relay, with the circuit being maintained closed through the contacts 137. Closing of the contacts 138 also serves to energize the motor 32 and the transformer 126 so that upon contact of the welding head 95 with the ribbon R, a welding pulse will be applied to secure the ribbon R to the lead L of the semiconductor translating device. The delivery of the welding current to the welding head 95 is effected by closure of the switch 118, by action of the cam 37, with the cam 34 serving to open the switch 116, de-energize the coil 136 and prepare the apparatus for the next cycle thereof.

In operation, at the beginning of a cycle, the apparatus of the present invention will be substantially in the position shown in Fig. 1. A lead L, which may be provided with a bead B positioned at a predetermined distance from an end of the lead, is first inserted into the chuck 123 and the chuck is moved to the position shown in Fig. 1. Upon closure of the master switch 135, as previously described, the shaft 31 will be rotated whereby to rotate the various cams carried thereby. The lobes of the cams on the shaft 31 are arranged in a manner so that the face cam 41 will first permit the plate 48 and tension mechanism 63 to move inwardly toward the welding and operating position of the device whereby to extend a measured length of ribbon R from one side of the cutter guide member 100 and to a position overlying the end of a lead L extending outwardly from the chuck 123. Thereafter, the lobe 94 of the cam 36 will leave the follower 88 of the arm 77, whereby to permit the tension spring 91 to move the welding head 95 into contact with the portion of the ribbon R overlying the end of the lead L. Upon continued rotation of the shaft 31 in the direction indicated by the arrows in Figs. 4, 5, 6 and 7, the lobe 122 of the cam 37 will engage the roller 121 of the switch 118 whereby to close the switch 118 and apply a welding pulse through the welding head 95 to spotweld the ribbon R to the end of the lead L. Upon further rotation of shaft 31, the face cam 41 and the surface 56 thereof will act through the follower 54 to next move the plate 48 and tension mechanism 63 in a direction away from the cutter mechanism 75 whereby to withdraw a next measured length of ribbon from the spool 43 with this length being maintained in tension between the spring 68 and the grooves 66 and by means of the screws 72. The fact that, at this time, the end of the ribbon R is affixed to the lead L prevents withdrawal of the ribbon from the groove 112 and insures deployment from the spool 43. The follower 54 thereafter dwells and serves no further purpose until the next cycle of the apparatus.

After the welding of the ribbon to the lead has been accomplished, the lobe 113 of the cam 38 is adapted to move the cutter blade 103 to the position shown by the dotted lines in Fig. 8, whereby to sever a portion of the ribbon R from the supply at a point along one surface of the cutter guide member 100. Following this operation, the cutter blade 103 is withdrawn by further action of the cam 38 and compression spring 110 and the welding head 95 is also withdrawn from the position shown in Fig. 10 to the position shown in Fig. 1 by action of the cam 36. Finally, the cam 34 rotates to a position to open the normally closed switch 116 whereby to de-energize the electrical circuit as described hereinbefore.

Following welding of a strip of ribbon onto the end of a lead of a semiconductor translating device, the subassembly of such device may thereafter be positioned in conjunction with adjacently disposed apparatus for further formation thereof, as for example, in a kinking apparatus whereby a predetermined bend or kink is applied to the portion of the ribbon extending laterally beyond the end of the lead L. For this purpose, the chuck supporting arm 124 is pivoted on the trunnions 125 and may be swung over the axis of the bearing 50 to a position in an adjacent apparatus.

Thus, it is to be noted that the device of the present invention performs the necessary function of applying a strip of ribbon to the end of the lead L in the prescribed and precise manner necessary in the construction of delicate components of semiconductor translating devices. In this connection, it is to be understood that the present device will operate equally well with wire or material of other cross sectional configurations, rather than the ribbon R, without departing from the spirit and scope hereof.

Having thus described the invention and the present embodiment thereof, it is desired to emphasize the fact that many modifications may be resorted to in a manner limited only by a just interpretation of the following claims.

What is claimed is:

1. A material welding and cutoff apparatus for manufacturing subassembly components of semiconductor translating devices comprising, in combination: a base structure; a platform pivotally carried on said base structure; a spool mounted for rotation on said platform, said spool being adapted to support a supply of ribbon material; a guide for said ribbon, said guide being carried by said platform; means operatively associated with said guide for restricting movement of said ribbon through said guide; a driving shaft; a platform reciprocating cam carried by said shaft whereby to move said platform about said pivot therefor; chuck means for supporting a lead element of said subassembly, said ribbon being adapted to be fed through said guide to a position wherein a portion thereof will overlie an end of said lead; a welding head mounted for movement on said base structure; welding head operating cam means carried by said driving shaft for moving said head into contact with said portion of said ribbon; means for energizing said head to weld said ribbon to said lead; a ribbon cutter mounted on said base structure; and further cam means carried by said shaft and adapted for operation of said cutter to sever said portion of said ribbon from said supply thereof, said reciprocating cam being adapted for movement of said platform in a direction to withdraw said ribbon from said supply prior to said severing action of said cutter.

2. A material welding and cutoff apparatus for manufacturing subassembly components of semiconductor translating devices comprising, in combination: a base structure; a platform pivotally carried on said base structure; a spool mounted for rotation on said platform, said spool being adapted to support a supply of ribbon material; a guide for said ribbon, said guide being carried by said platform; means operatively associated with said guide for restricting movement of said ribbon through said guide; a driving shaft; a platform reciprocating cam carried by said shaft whereby to move said platform about said pivot therefor; chuck means for supporting a lead element of said subassembly, said ribbon being adapted to be fed through said guide to a position wherein a portion thereof will overlie an end of said lead; a welding head mounted for movement on said base structure; welding head operating cam means carried by said driving shaft for moving said head into contact with said portion of said ribbon; means for energizing said head to weld said ribbon to said lead; a ribbon cutter mounted on said base structure; a longitudinal slot for said ribbon in said cutter, said slot closely confining said ribbon and in substantial longitudinal alignment with said guide; and further cam means carried by said shaft and adapted for operation of said cutter to sever said portion of said ribbon from said supply thereof as said ribbon emerges from said slot.

3. A material welding and cutoff apparatus for manufacturing subassembly components of semiconductor translating devices comprising, in combination: a base structure; a platform pivotally carried on said base structure; a spool mounted for rotation on said platform, said spool being adapted to support a supply of ribbon material; a guide for said ribbon, said guide being carried by said platform; means operatively associated with said guide for restricting movement of said ribbon through said guide; a driving shaft; a platform reciprocating cam carried by said shaft whereby to move said platform about said pivot therefor; chuck means for supporting a lead element of said subassembly, said ribbon being adapted to be fed through said guide to a position wherein a portion thereof will overlie an end of said lead; a welding head mounted for movement on said base structure; welding head operating cam means carried by said driving shaft for moving said head into contact with said portion of said ribbon; means for energizing said head to weld said ribbon to said lead; a ribbon cutter mounted on said base structure; further cam means carried by said shaft and adapted for operation of said cutter to sever said portion of said ribbon from said supply thereof; and cam operated switch means for de-energizing said apparatus following completion of one cycle thereof.

4. A material welding and cutoff apparatus for manufacturing subassembly components of semiconductor translating devices comprising, in combination: a base structure; a platform pivotally carried on said base structure; a spool mounted for rotation on said platform, said spool being adapted to support a supply of ribbon material; a guide for said ribbon, said guide being carried by said platform; means operatively associated with said guide for restricting movement of said ribbon through said guide; a driving shaft; a platform reciprocating cam carried by said shaft whereby to move said platform about said pivot therefor; chuck means for supporting a lead element of said subassembly, said ribbon being adapted to be fed through said guide to a position wherein a portion thereof will overlie an end of said lead; a welding head mounted for movement on said base structure; welding head operating cam means carried by said driving shaft for moving said head into contact with said portion of said ribbon; means for energizing said head to weld said ribbon to said lead; a ribbon cutter mounted on said base structure; a longitudinal slot for said ribbon in said cutter, said slot closely confining said ribbon and in substantial longitudinal alignment with said guide; further cam means carried by said shaft and adapted for operation of said cutter to sever said portion of said ribbon from said supply thereof as said ribbon emerges from said slot, said reciprocating cam being adapted for movement of said platform in a direction to withdraw said ribbon from said supply prior to said severing action of said cutter; and cam operated switch means for de-energizing said apparatus following completion of one cycle thereof.

5. A material welding and cutoff apparatus for manufacturing subassembly components of semiconductor translating devices comprising, in combination: a base structure; and L-shaped platform pivotally carried on said base structure; a spool mounted for rotation about a vertical axis on said platform, said spool being adapted to support a supply of ribbon material; a guide for said ribbon, said guide being carried by and reciprocable with said platform; adjustable mechanical pressure means operatively associated with said guide for restricting movement of said ribbon through said guide; a common driving shaft; means to drive said shaft; a platform reciprocating cam carried by said shaft; a cam follower carried by said platform and cooperable with said cam, whereby to move said platform about said pivot therefor; chuck means for supporting a lead element of said subassembly, said ribbon being adapted to be fed through said guide to a position wherein a portion thereof will overlie an end of said lead; an electrically operable spot welding head mounted for movement on said base structure; welding head operating cam means carried by said driving shaft for moving said head into contact with and in a direction away from said portion of said ribbon; cam operated switch means for energizing said head to weld said ribbon to said lead; a ribbon cutter mounted on said base structure; and further cam means carried by said shaft and adapted for operation of said cutter to sever said portion of said ribbon from said supply thereof.

6. A material welding and cutoff apparatus for manufacturing subassembly components of semiconductor translating devices comprising, in combination: a base structure; an L-shaped platform pivotally carried on said base structure; a spool mounted for rotation about a vertical axis on said platform, said spool being adapted to support a supply of ribbon material; a guide for said ribbon, said guide being carried by and reciprocable with said platform; adjustable mechanical pressure means operatively associated with said guide for restricting movement of said ribbon through said guide; a common driving shaft; means to drive said shaft; a platform reciprocating cam carried by said shaft; a cam follower carried by said platform and cooperable with said cam, whereby to move said platform about said pivot therefor; chuck means pivotally mounted on said base structure for supporting a lead element of said subassembly, said ribbon being adapted to be fed through said guide to a position wherein a portion thereof will overlie an end of said lead; an electrically operable spot welding head mounted for movement on said base structure; welding head operating cam means carried by said driving shaft for moving said head into contact with and in a direction away from said portion of said ribbon; cam operated switch means for energizing said head to weld said ribbon to said lead; a ribbon cutter mounted on said base structure; a longitudinal slot for said ribbon in said cutter, said slot closely confining said ribbon and in substantial longitudinal alignment with said guide; further cam means carried by said shaft and adapted for operation of said cutter to sever said portion of said ribbon from said supply thereof as said ribbon emerges from said slot, said reciprocating cam being adapted for movement of said platform in a direction to withdraw said ribbon from said supply prior to said severing action of said cutter; and cam operated switch means for deenergizing said apparatus following completion of one cycle thereof.

References Cited in the file of this patent

UNITED STATES PATENTS

| | | |
|---|---|---|
| 2,110,271 | May | Mar. 8, 1938 |
| 2,322,290 | Gabel | June 22, 1943 |
| 2,339,884 | Schlumpf | Jan. 25, 1944 |